United States Patent
Chandrachood et al.

(10) Patent No.: US 8,202,441 B2
(45) Date of Patent: *Jun. 19, 2012

(54) PROCESS FOR ETCHING A METAL LAYER SUITABLE FOR USE IN PHOTOMASK FABRICATION

(75) Inventors: Madhavi R. Chandrachood, Sunnyvale, CA (US); Nicole Sandlin, Sunnyvale, CA (US); Yung-Hee Yvette Lee, San Jose, CA (US); Jian Ding, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 226 days.

This patent is subject to a terminal disclaimer.

(21) Appl. No.: 12/728,455

(22) Filed: Mar. 22, 2010

(65) Prior Publication Data

US 2010/0178600 A1    Jul. 15, 2010

Related U.S. Application Data

(63) Continuation of application No. 11/616,990, filed on Dec. 28, 2006, now Pat. No. 7,682,518, which is a continuation of application No. 10/925,887, filed on Aug. 25, 2004, now Pat. No. 7,521,000.

(60) Provisional application No. 60/498,730, filed on Aug. 28, 2003.

(51) Int. Cl.
C03C 15/00    (2006.01)

(52) U.S. Cl. ............ 216/67; 216/68; 216/75; 216/76
(58) Field of Classification Search .............. 216/67, 216/68, 75, 76
See application file for complete search history.

(56) References Cited

U.S. PATENT DOCUMENTS

| 5,972,125 | A |  | 10/1999 | Hedge |  |
| 6,402,886 | B2 | * | 6/2002 | Stocks et al. | 156/345.51 |
| 7,521,000 | B2 | * | 4/2009 | Chandrachood et al. | 216/67 |
| 7,682,518 | B2 | * | 3/2010 | Chandrachood et al. | 216/67 |
| 2002/0076626 | A1 | * | 6/2002 | Montgomery et al. | 430/5 |
| 2002/0155723 | A1 | * | 10/2002 | Sasaki et al. | 438/706 |
| 2003/0089680 | A1 | * | 5/2003 | Johnson et al. | 216/68 |

FOREIGN PATENT DOCUMENTS

WO    WO-0196955 A2    12/2001

* cited by examiner

*Primary Examiner* — Binh X Tran
(74) *Attorney, Agent, or Firm* — Patterson & Sheridan, LLP

(57) ABSTRACT

Method and apparatus for etching a metal layer disposed on a substrate, such as a photolithographic reticle, are provided. In one aspect, a method is provided for processing a substrate including positioning a substrate having a metal layer disposed on an optically transparent material in a processing chamber, introducing a processing gas processing gas comprising an oxygen containing gas, a chlorine containing gas, and a chlorine-free halogen containing gas, and optionally, an inert gas, into the processing chamber, generating a plasma of the processing gas in the processing chamber, and etching exposed portions of the metal layer disposed on the substrate.

17 Claims, 3 Drawing Sheets

PROCESS FOR ETCHING A METAL LAYER SUITABLE FOR USE IN PHOTOMASK FABRICATION

CROSS-REFERENCE TO RELATED APPLICATIONS

This application is a continuation of U.S. patent application Ser. No. 11/616,990, filed Dec. 28, 2006, now U.S. Pat. No. 7,682,518, which application is a continuation of U.S. patent application Ser. No. 10/925,887, filed Aug. 25, 2004, now U.S. Pat. No. 7,521,000, which application claims benefit of U.S. Provisional Patent Application Ser. No. 60/498,730, filed Aug. 28, 2003, all applications of which are incorporated by reference in their entireties. Priority to the filing dates of these applications is claimed.

BACKGROUND OF THE INVENTION

1. Field of the Invention

The present invention relates to the fabrication of integrated circuits and to the fabrication of photolithographic reticles useful in the manufacture of integrated circuits.

2. Background of the Related Art

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.15 µm and even 0.13 µm feature sizes, and tomorrow's plants soon will be producing devices having even smaller geometries.

The increasing circuit densities have placed additional demands on processes used to fabricate semiconductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates.

High aspect ratio features are conventionally formed by patterning a surface of a substrate to define the dimensions of the features and then etching the substrate to remove material and define the features. To form high aspect ratio features with a desired ratio of height to width, the dimensions of the features are required to be formed within certain parameters that are typically defined as the critical dimensions of the features. Consequently, reliable formation of high aspect ratio features with desired critical dimensions requires precise patterning and subsequent etching of the substrate.

Photolithography is a technique used to form precise patterns on the substrate surface, and then the patterned substrate surface is etched to form the desired device or features. Photolithography techniques use light patterns and resist materials deposited on a substrate surface to develop precise patterns on the substrate surface prior to the etching process. In conventional photolithographic processes, a resist is applied on the layer to be etched, and the features to be etched in the layer, such as contacts, vias, or interconnects, are defined by exposing the resist to a pattern of light through a photolithographic reticle having a photomask layer disposed thereon. The photomask layer corresponds to the desired configuration of features. A light source emitting ultraviolet (UV) light or low X-ray light, for example, may be used to expose the resist in order to alter the composition of the resist. Generally, the exposed resist material is removed by a chemical process to expose the underlying substrate material. The exposed underlying substrate material is then etched to form the features in the substrate surface while the retained resist material remains as a protective coating for the unexposed underlying substrate material.

Binary photolithographic reticles typically include a substrate made of an optically transparent silicon-based material, such as quartz (i.e., silicon dioxide, $SiO_2$), having an opaque light-shielding layer of metal, or photomask, typically chromium, disposed on the surface of the substrate. The light-shielding layer is patterned to correspond to the features to be transferred to the substrate. Binary photolithographic reticles are fabricated by first depositing a thin metal layer on a substrate comprising an optically transparent silicon-based material, and then depositing a resist layer on the thin metal layer. The resist is then patterned using conventional laser or electron beam patterning equipment to define the critical dimensions to be transferred to the metal layer. The metal layer is then etched to remove the metal material not protected by the patterned resist; thereby exposing the underlying optically transparent material and forming a patterned photomask layer. Photomask layers allow light to pass therethrough in a precise pattern onto the substrate surface.

Conventional etching processes, such as wet etching, tend to etch isotropically, which can result in an undercut phenomenon in the metal layer below the patterned resist. The undercut phenomenon can produce patterned features on the photomask that are not uniformly spaced and do not have desired straight, vertical sidewalls, thereby losing the critical dimensions of the features. Additionally, the isotropic etching of the features may overetch the sidewalls of features in high aspect ratios, resulting in the loss of the critical dimensions of the features. Features formed without the desired critical dimensions in the metal layer can detrimentally affect light passing therethrough and result in less than desirable patterning by the photomask in subsequent photolithographic processes.

Plasma etch processing, known as dry etch processing or dry etching, provides a more anisotropic etch than wet etching processes. The dry etching process has been shown to produce less undercutting and to improve the retention of the critical dimensions of the photomask features with straighter sidewalls and flatter bottoms. However, dry etching may overetch or imprecisely etch the sidewalls of the openings or pattern formed in the resist material used to define the critical dimensions of the metal layer. Excess side removal of the resist material results in a loss of the critical dimensions of the patterned resist features, which may translate to a loss of critical dimensions of the features formed in the metal layer defined by the patterned resist layer. Further, imprecise etching may not sufficiently etch the features to provide the necessary critical dimensions. Failure to sufficiently etch the features to the critical dimensions is referred to as a "gain" of critical dimensions. The degree of loss or gain of the critical dimensions in the metal layer is referred to as "etching bias" or "CD bias". The etching bias can be as large as 120 nm in photomask patterns used to form 0.14 µm features on substrate surfaces.

The loss or gain of critical dimensions of the pattern formed in the metal layer can detrimentally affect the light passing therethrough and produce numerous patterning defects and subsequent etching defects in the substrate patterned by the photolithographic reticle. The loss or gain of critical dimensions of the photomask can result in insufficient photolithographic performance for etching high aspect ratios of sub-micron features and, if the loss or gain of critical dimensions is severe enough, the failure of the photolithographic reticle or subsequently etched device.

Therefore, there remains a need for a process and chemistry for etching a metal layer on a substrate, such as a reticle, to produce a pattern with desired critical dimensions in the metal layer.

SUMMARY OF THE INVENTION

Aspects of the invention generally provide methods and related chemistry for etching a photomask layer for a photolithographic reticle. In one aspect, a method is provided for processing a photolithographic reticle including positioning the reticle on a support member in a processing chamber, wherein the reticle comprises a metal photomask layer formed on an optically transparent substrate and a patterned resist material deposited on the metal photomask layer, introducing a processing gas comprising an oxygen containing gas, a chlorine containing gas, and a chlorine-free halogen containing gas, delivering power to the processing chamber to generate a plasma of the processing gas, and removing exposed portions of the metal photomask layer.

In another aspect, a method is provided for processing a photolithographic reticle including positioning the reticle on a support member in a processing chamber, wherein the reticle comprises a chromium-based photomask layer formed on an optically transparent silicon-based material and a patterned resist material deposited on the chromium-based photomask layer, introducing a processing gas comprising chlorine gas, oxygen gas, and hydrogen bromide, maintaining a chamber pressure between about 2 milliTorr and about 20 milliTorr, delivering a source power between about 100 and about 1000 watts to a coil disposed in the processing chamber to generate a plasma, supplying a bias power to the support member between about 0 and about 150 watts, and etching exposed portions of the chromium-based photomask layer, and removing the chromium-based photomask layer at a removal rate ratio of chromium-based photomask layer to resist material of about 1:1 or greater.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE EXEMPLARY EMBODIMENT

Aspects of the invention will be described below in reference to an inductively coupled plasma etch chamber. Suitable inductively coupled plasma etch chambers include the ETEC Tetra I™ photomask etch chamber and the ETEC Tetra II™ photomask etch chamber, available from ETEC of Hayward, Calif., or optionally, a Decoupled Plasma Source (DPS I™, DPS II™, and DPS +™) processing chamber available from Applied Materials, Inc., of Santa Clara, Calif.

Other process chambers may be used to perform the processes of the invention, including, for example, capacitively coupled parallel plate chambers and magnetically enhanced ion etch chambers as well as inductively coupled plasma etch chambers of different designs. Examples of such suitable processing chambers are disclosed in U.S. patent application Ser. No. 09/325,026, filed on Jun. 3, 1999, which is incorporated by reference to the extent not inconsistent with the claims and disclosures described herein. Although the processes are advantageously performed with the ETEC Tetra™ photomask etch chamber, the description in conjunction with the DPS™ processing chamber is illustrative, and should not be construed or interpreted to limit the scope of any aspect of the invention.

Figure 1:
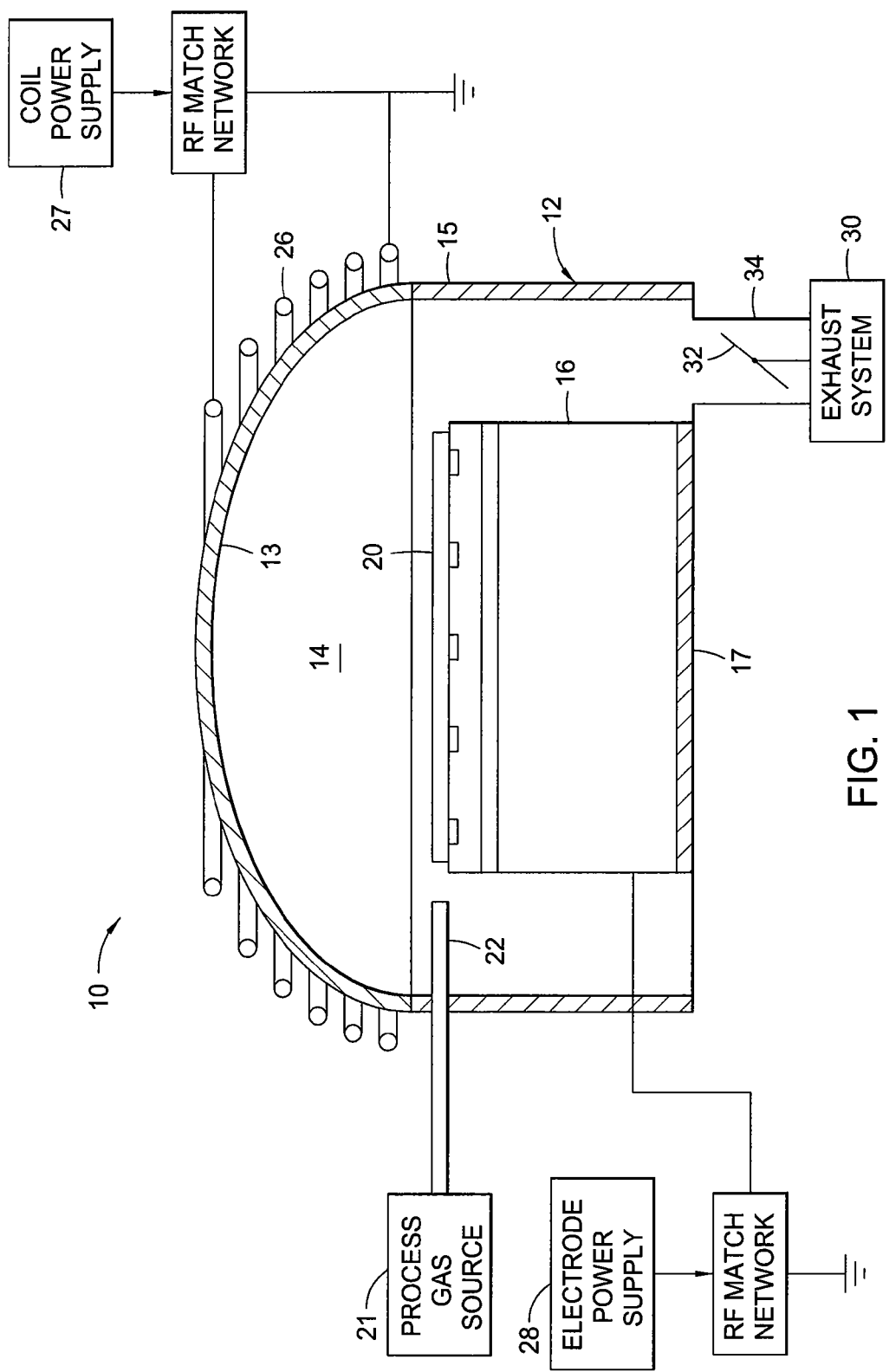
FIG. 1 is a schematic cross-sectional view of one embodiment of an etching chamber.

FIG. 1 is a schematic cross-sectional view of one embodiment of a DPS™ processing chamber that may be used for performing the processes described herein. The processing chamber 10 generally includes a cylindrical sidewall or chamber body 12, an energy transparent dome 13 mounted on the body 12, and a chamber bottom 17. A flat lid (not shown) or other alternative lid capable of being used with an inductive coil may be used in place of the dome 13. An inductive coil 26 is disposed around at least a portion of the dome 13. The chamber body 12 and the chamber bottom 17 of the processing chamber 10 can be made of a metal, such as anodized aluminum, and the dome 13 can be made of an energy transparent material such as a ceramic or other dielectric material.

A substrate support member 16 is disposed in the processing chamber 10 to support a substrate 20 during processing. The support member 16 may be a conventional mechanical or electrostatic chuck with at least a portion of the support member 16 being electrically conductive and capable of serving as a process bias cathode. While not shown, a reticle adapter may be used to secure the reticle on the support member 16. The reticle adapter generally includes a lower portion milled to cover an upper portion of the support member and a top portion having an opening that is sized and shaped to hold a reticle. A suitable reticle adapter is disclosed in U.S. Pat. No. 6,251,217, issued on Jun. 26, 2001, which is incorporated herein by reference to the extent not inconsistent with aspects and claims of the invention.

Processing gases are introduced into the processing chamber 10 from a process gas source 21 through a gas distributor 22 peripherally disposed about the support member 16. Mass flow controllers (not shown) for each processing gas, or alternatively, for mixtures of the processing gas, are disposed between the processing chamber 10 and the process gas source to regulate the respective flow rates of the process gases. The mass flow controllers can regulate up to about 1000 sccm flow rate for each processing gas or processing gas mixture.

A plasma zone 14 is defined by the process chamber 10, the substrate support member 16 and the dome 13. A plasma is formed in the plasma zone 14 from the processing gases using a coil power supply 27 to power the inductor coil 26 to generate an electromagnetic field in the plasma zone 14. The support member 16 includes an electrode disposed therein, which is powered by an electrode power supply 28 and generates a capacitive electric field in the processing chamber 10. Typically, RF power is applied to the electrode in the support member 16 while the body 12 is electrically grounded. The capacitive electric field is transverse to the plane of the support member 16, and influences the directionality of charged species to provide more vertically oriented anisotropic etching of the substrate 20.

Process gases and etchant byproducts are exhausted from the process chamber 10 through an exhaust system 30. The exhaust system 30 may be disposed in the bottom 17 of the processing chamber 10 or may be disposed in the body 12 of the processing chamber 10 for removal of processing gases. A throttle valve 32 is provided in an exhaust port 34 for controlling the pressure in the processing chamber 10. An optical endpoint measurement device can be connected to the processing chamber 10 to determine the endpoint of a process performed in the chamber.

While the following process description illustrates one embodiment of etching a substrate using processing gases as described herein, the invention contemplates the use of processing parameters outside the ranges described herein for performing this process in different apparatus, such as a different etching chamber, and for different substrate sizes, such as photolithographic reticles for 300 mm substrate processing.

Exemplary Etch Process

While the following description illustrates one embodiment of a process sequence for etching metal layers, such as chromium and chromium oxynitride, as photomasks in photolithographic reticle fabrication, it is contemplated that the etching gases may be used to etch other material layers formed on substrates in semiconductor and photolithographic reticle manufacturing.

Generally a photolithographic reticle includes an opaque layer, known as a photomask, deposited on an optically transparent substrate. The opaque layer may comprise a metal layer, for example, chromium, or another material known or unknown in the art suitable for use as a photomask. For example, the invention contemplates that the opaque layer may comprise a non-metallic dielectric material. An optically transparent material of the substrate is broadly defined to include, but not limited to, a material transparent to light having wavelengths of about 300 nm or less, for example, transparent to ultraviolet light having wavelengths of 248 nm and 193 nm.

Figure 2:
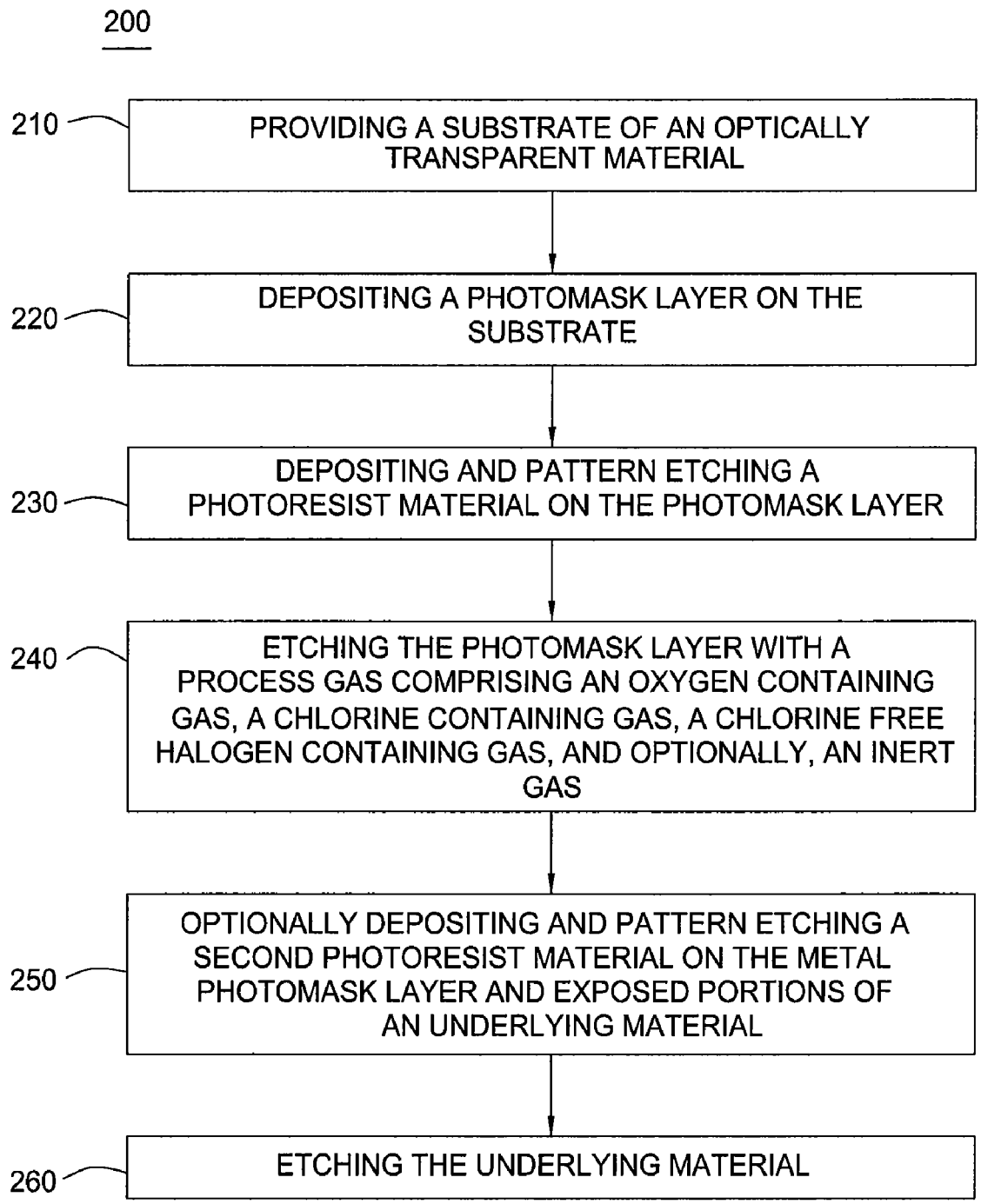
FIG. 2 is a flow chart illustrating one embodiment of a sequence for processing a substrate according to one embodiment of the invention.
Figure 3A:
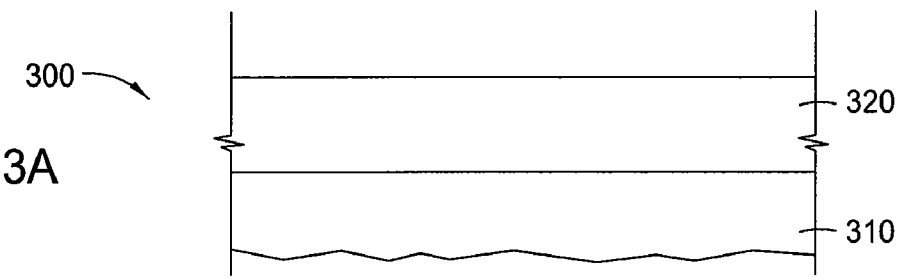
FIGS. 3A-3D are cross-sectional views showing an etching sequence of another embodiment of the invention.
Figure 3B:
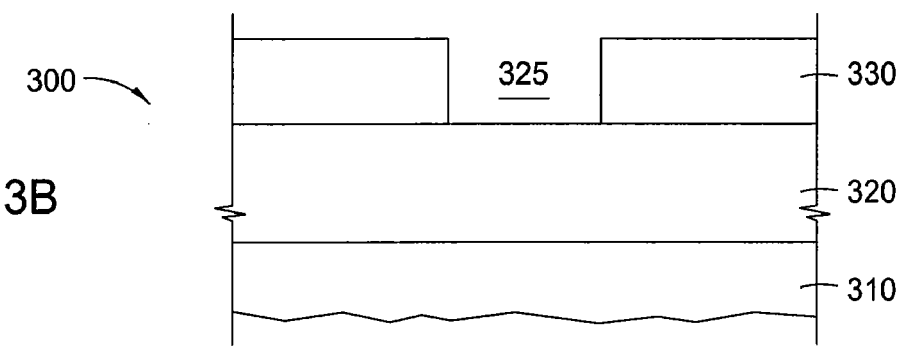
Figure 3C:
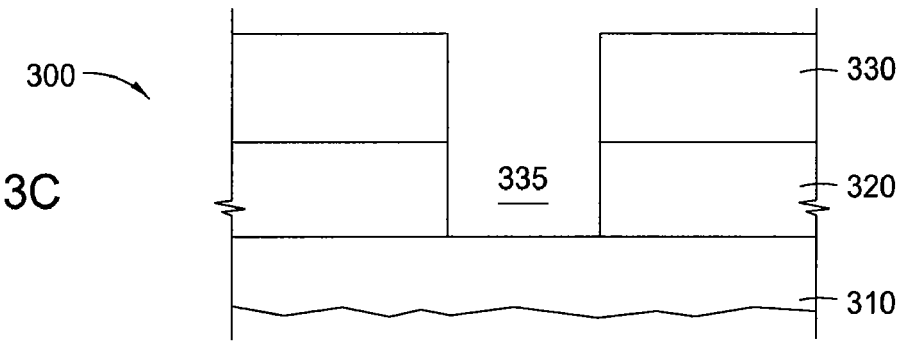

FIG. 2 is a flow chart of one embodiment of one process sequence of an etching process 200. The flow chart is provided for illustrative purposes and should not be construed as limiting the scope of any aspects of the invention. FIGS. 3A-3C illustrate the composition of the photolithographic reticle at points during the photomask forming process as well as further illustrate the process described above in FIG. 2.

A substrate 300, typically comprising an optically transparent material 310, such as optical quality quartz, fused silica material, molybdenum silicide (MoSi), molybdenum silicon oxynitride ($MoSi_xN_yO_z$), calcium fluoride, alumina, sapphire, or combinations thereof, is provided to a processing chamber at step 210, such as the DPS™ processing chamber 10 of FIG. 1.

The substrate is then processed by depositing an opaque metal layer 320 as a metal photomask layer, typically comprising chromium, on the substrate material 310 at step 220 as shown in FIG. 3A. The chromium layer may be deposited by conventional methods known in the art, such as by physical vapor deposition (PVD) or chemical vapor deposition (CVD) techniques. The metal layer 320 is typically deposited to a thickness between about 50 and about 100 nanometers (nm); however, the thickness of the metal layer 320 may differ based upon the requirements of the manufacturer and the composition of the materials of the substrate or metal layer.

Optionally, an anti-reflective coating (ARC or ARC layer) may be formed on or comprise part of the deposited metal layer 320. The ARC layer is believed to improve photolithographic precision in patterning features to be formed in the opaque layer. The ARC layer may be a metal layer incorporating nonmetallic contaminants or impurities to form, for example a metal oxynitride layer, such as chromium oxynitride. Chromium oxynitride may be formed during deposition of the metal layer or by exposing the metal layer to a suitable atmosphere, such as an oxidizing and nitrating environment. Alternatively, the chromium oxynitride layer may be deposited by conventional methods known in the art, such as by physical vapor deposition (PVD) or chemical vapor deposition (CVD) techniques. The metal oxynitride layer may comprise up to the top 25% of the total thickness of the metal layer 320.

The optional ARC layer is typically formed at a thickness between about 10 nanometers (nm) and about 15 nm; however, the thickness of the layer may differ based upon the requirements of the manufacturer and the composition of the materials of the substrate or metal layer, and may be mainly concentrated in the upper surface of the deposited material, such as the upper 30% of the thickness of the original metal layer 320. The chromium oxynitride film is believed to be more sensitive to etching with oxygen radicals than chromium films. A reduced amount of oxygen in the processing gas may be used to effectively etch the chromium oxynitride surface compared to etching the bulk of the remaining chromium material.

The dimensions of openings or patterns in the metal layer 320 are patterned by depositing and pattern etching a resist material 330 to expose the metal layer 320 at step 230 as shown in FIG. 3B. The resist materials used in photolithographic reticle fabrication are usually low temperature resist materials, which are defined herein as materials that thermally degrade at temperatures above about 250° C., an example of which includes "ZEP," manufactured by Hoya Corporation or others described herein. The resist material 330 is deposited upon the metal layer 320 to a thickness between about 200 nm and about 600 nm.

The resist material may be a photoresist material, which may be patterned optically using a laser patterning device or by another radiative energy patterning device, such as an electron beam emitter to form a pattern 325 that is used to define the dimensions of the feature definition to be formed in the metal layer 320.

The opaque, metal layer then is etched to produce a photomask layer having features with desired critical dimensions. The substrate 300 is then transferred to an etch chamber, such as the DPS™ processing chamber 10 described above, for etching the metal layer 320. Openings and patterns 335 are formed in the metal layer 320 by etching the metal layer using the processing gas described herein including the oxygen containing gas, chlorine containing gas, chlorine-free halogen containing gas, and optionally, an inert gas, to expose the underlying optically transparent substrate material, and optionally, an ARC layer, at step 240 as shown in FIG. 3C.

Etching of exposed portions of the opaque metal layer 320 occurs by generating a plasma of a processing gas by supplying a source power and/or a bias power to the processing chamber. The processing gas includes an oxygen containing gas, a chlorine-containing gas, a chlorine-free halogen containing gas, and optionally, an inert gas, for etching the metal layer.

The oxygen containing gas is selected from the group comprising one or more of oxygen ($O_2$), carbon monoxide (CO), carbon dioxide ($CO_2$), and combinations thereof, of which oxygen is preferred. The oxygen containing gas provides a source of etching radicals and carbon monoxide (CO) and carbon dioxide ($CO_2$) gases may provide a source of material for forming passivating polymer deposits, which may improve etch bias.

The chlorine containing gas is selected from the group comprising one or more of chlorine gas ($Cl_2$), carbon tetrachloride ($CCl_4$), hydrogen chloride (HCl), and combinations thereof, of which $Cl_2$ is preferred, which are used to supply highly reactive radicals to etch the metal layer. The chlorine containing gas provides a source of etching radicals and components, such as carbon tetrachloride ($CCl_4$) gas, that may provide a source of material for forming passivating polymer deposits that may improve etch bias.

The chlorine-free halogen containing gas is selected from the group comprising one or more of hydrogen bromide (HBr), hydrogen iodide (HI), and combinations thereof, of which HBr is preferred. Hydrogen bromide may also be delivered to processing from an aqueous solution or have an aqueous component as hydrobromic acid. The chlorine-free halogen containing gas is used to supply both reactive radicals to etch the metal layer as well as hydrogen, which may reduce photoresist and metal etch rates and passivate the photoresist and metal sidewalls to minimize overetching and preserve desired critical dimensions, and improve etch bias.

The chlorine containing gas and the chlorine-free halogen containing gas are provided in a molar ratio of chlorine containing gas to the chlorine-free halogen containing gas between about 10:1 and about 0.5:1, for example, a chlorine to hydrogen bromide molar ratio between about 10:1 and about 0.5:1.

The processing gas may also include an inert gas which, when ionized as part of the plasma including the processing gas, results in sputtering species to increase the etching rate of the features. The presence of an inert gas as part of the plasma may also enhance dissociation of the active processing gases. Examples of inert gases include argon (Ar), helium (He), neon (Ne), xenon (Xe), krypton (Kr), and combinations thereof, of which argon and helium are generally used. The inert gases typically comprise between about 5 vol % and about 40 vol %, such as between about 15 vol % and about 25 vol % of the total gas flow for the process. For plasma striking to initiate the plasma prior to introducing the etching processing gas, the inert gas may comprise between about 75 vol % and about 100 vol % of the process gas used.

The total flow rate of the processing gas, including the inert gas, is introduced at a flow rate between about 100 sccm and about 700 sccm for etching a 150 mm by 150 mm square photolithographic reticles in an etch chamber. The oxygen containing gas may be introduced into the processing chamber at a flow rate between about 5 sccm and about 200 sccm, for example, about 12 sccm, the chlorine containing gas is introduced into the processing chamber at a flow rate of between about 5 sccm and about 250 sccm, for example, about 96 sccm, and the chlorine-free halogen containing gas is introduced into the processing chamber at a flow rate of between about 5 sccm and about 250 sccm, for example, between about 10 sccm and about 50 sccm. When the inert gas is introduced into the processing chamber, a flow rate between about 25 sccm and about 100 sccm may be used for etching a 150 mm by 150 mm square photolithographic reticles in the etch chamber.

The individual and total gas flows of the processing gases may vary based upon a number of processing factors, such as the size of the processing chamber, the size of the substrate being processed, and the specific etching profile desired by the operator.

Generally, a source RF power level of about 1000 watts or less is applied to an inductor coil to generate and sustain a plasma of the processing gases during the etching process. A power level between about 100 watts and about 1000 watts, such between about 250 watts and about 650 watts, has been observed to provide sufficient plasma of the processing gases for etching the substrate surface. The recited source RF power levels have been observed to produce sufficient etching radicals and polymerization radicals from the processing gases to etch the exposed metal layer disposed on the substrate while providing a sufficiently low power level, compared to prior art metal etch processes, for the substrate temperatures to be about 150° C. or less.

Generally, a bias power of less than about 200 watts, for example between about 0 watts and about 150 watts, is applied to the substrate to increase directionality of the etching radicals with respect to the surface of the substrate. A bias power of less than 50 watts, such as between about 20 watts and about 40 watts, may be used in the etching process. A bias between about 25 watts and 35 watts has been observed to provide sufficient directionality of etching radicals during the etching process.

The exposed material of the substrate surface may be etched by the plasma of the processing gases for between about 15 seconds and about 400 seconds, for example, between about 30 seconds and about 350 seconds, depending on the quantity of material to be etched. Any ARC layer material may be exposed to the plasma of the first processing gas for between about 5 seconds and about 180 seconds, for example between about 30 seconds and about 60 seconds, which may in addition to or inclusive of the total etching time.

Generally, the processing chamber pressure is maintained between about 2 milliTorr and about 50 milliTorr, preferably between about 2 milliTorr and about 20 milliTorr, for example, between about 3 milliTorr and about 8 milliTorr may be maintained during the etching process.

The substrate is also maintained at a temperature of about 150° C. or less during processing. A substrate temperature below about 150° C. or less has minimal heat degradation of materials, such as resist materials, deposited on the substrate during the photolithographic reticle fabrication processes with the processing gases described herein. The substrate temperature between about 20° C. and about 150° C., preferably between about 20° C. and about 50° C., may be used to etch photomask features with minimal heat degradation of material disposed on the substrate surface. Additionally, the sidewalls of the processing chamber are preferably maintained at a temperature of less than about 70° C., and the dome is preferably maintained at a temperature of less than about 80° C. to maintain consistent processing conditions and to minimize polymer formation on the surfaces of the processing chamber.

An example of the etching process is described as follows. The substrate is disposed on the support member 16 and a processing gas as described herein is introduced into the chamber and a plasma is generated or maintained to etch the metal layer 320 by introducing a processing gas of oxygen gas ($O_2$), chlorine gas ($Cl_2$), hydrogen bromide (HBr), and optionally, an inert gas, such as argon (Ar) or helium (He) at a flow rate between about 100 sccm and about 200 sccm and generating a plasma. Oxygen gas may be introduced into the processing chamber at a flow rate between about 5 sccm and about 50 sccm, chlorine gas may be introduced into the processing chamber at a flow rate between about 5 sccm and about 100 sccm, and hydrogen bromide gas may be introduced into the processing chamber at a flow rate between about 5 sccm and about 100 sccm. The inert gas, for example, helium, is introduced into the processing chamber at a flow rate between about 25 sccm and about 70 sccm. The ratio of chlorine gas to hydrogen bromide in the processing gas is between about 10:1 and about 0.5:1.

The plasma is generated by applying a source RF power between about 250 watts and about 650 watts, for example 400 watts, to an inductor coil to generate and sustain a plasma of the processing gases during the etching process. A bias power between about 20 watts and about 40 watts, for example about 20 watts, is applied to the substrate support. The etching process is performed between about 90 seconds and about 400 seconds, for example, about 350 seconds. Endpoint of the metal layer 320 etching process may be monitored by an optical emission endpoint control.

Generally, the processing chamber pressure is maintained between about 2 milliTorr and about 20 milliTorr, for example, at about 3 milliTorr, about 5 milliTorr, or about 8 milliTorr. The substrate temperature is between about 20° C. and about 100° C. during the etching process. Additionally, the sidewalls 15 of the processing chamber 10 are maintained at a temperature of less than about 70° C. and the dome is maintained at a temperature of less than about 80° C. The above described metal etching process generally produces a selectivity of metal layer to resist of about 3:1 or greater.

Alternatively, an overetch step may be performed after the etching process to ensure removal of all of the desired material from the substrate. The overetch may use any suitable processing gas for etching the metal layer 320. For example, the overetching gas may comprise one or more, including all, of the oxygen containing gas, the chlorine containing gas, the chlorine free halogen containing gas, and the inert gases described herein.

Alternatively, if an ARC material as described herein is formed on the metal layer, the ARC material may be removed with the metal layer during the metal layer etching process or may be removed by an etching process before etching of the metal layer. An example of a ARC etching process and metal layer etching process is more fully described in U.S. patent application Ser. No. 10/803,867, filed on Mar. 18, 2004, and entitled "Multi-Step Process For Etching Photomasks", which is incorporated by reference to the extent not inconsistent with the claimed aspects and disclosure herein The etching process described herein under the conditions disclosed produces a removal rate ratio, i.e., selectivity or etch bias, of metal layer to resist of about 1:1 or greater. A selectivity of metal to resist of about 1:1 or greater has been observed in substrate processed by the etching process described herein. A selectivity of metal to resist of about 3:1 or greater has been observed in substrate processed by the etching process described herein. The increased selectivity results in the etching processes preserve the critical dimension patterned in the photoresist layer and allows for etched chromium features to have the desired critical dimensions.

The etching processes as described herein were also observed to remove "top" or upper surface resist material independent of "side" within feature resist material, which is consistent with anisotropic etching and improved feature formation. Additionally, processed substrates have produced features with the desired critical dimensions with an almost vertical profile, i.e., an angle of about 90° between the sidewall of the feature and the bottom of the feature compared to prior art result of about 85° to about 88°.

Optionally, a plasma strike may be used to generate the plasma for etching the metal layer 320. A plasma strike may be used to initiate or generate the plasma prior to introducing the processing gas at the compositions and flow rates described herein for the etching process. The plasma strike may use an inert gas or a composition of the processing gases described herein.

The processing conditions and the plasma conditions of the plasma strike process may approximate those of the etching process with the processing gas described herein including processing gas constituents of the processing gas, total flow rates, chamber pressures, source power, and bias power. The plasma strike process may be for about 15 seconds or less, such as between about 3 seconds and about 5 seconds. An example of plasma striking includes establishing the chamber pressure between about 2 milliTorr and about 50 milliTorr, for example, between about 20 milliTorr and about 30 milliTorr, supplying a source power to a coil at a range between about 250 watts and about 1000 watts, such as about 400 watts, and/or supplying a bias at a range between about 1 watt and about 50 watts, such as between about 20 watts and about 40 watts. The source power used to strike the plasma may be less than the power used during etching of the substrate.

Figure 3D:
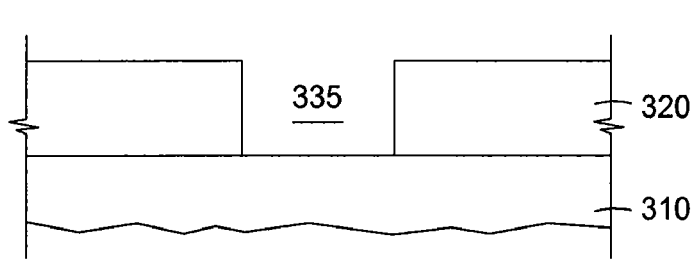

After etching of the metal layer 320 is completed, the substrate 300 is transferred to a processing chamber, and the remaining resist material 330 is usually removed from the substrate 300, such as by an oxygen plasma process, or other resist removal technique known in the art as shown in FIG. 3D.

Optionally, an attenuating material may used to form an attenuating phase shift photomasks to increase the precision of the etching pattern formed on the substrate by increasing the resolution of the light passing through the photomask. An attenuating material, such as molybdenum silicide (MoSi) or derivative may be disposed between the opaque metal layer 320 and the optically transparent substrate surface 310 may then be etched. The attenuating material may be deposited on the optically transparent substrate or may be integrated in the optically transparent substrate during manufacturing of the optically transparent substrate. For example, if an attenuating material is disposed on the substrate surface prior to deposition of the metal layer 320, the attenuating material may be formed by depositing and patterning a second photo resist material on the now patterned metal layer 320 to expose the underlying material at step 250. The underlying material of the attenuating material, or the exposed substrate itself if appropriate, may be then be etched with an etching gases suitable for such materials at step 260.

An example of etching the optically transparent material, such as silicon-based material, and attenuating materials of the substrate is more fully described in U.S. patent application Ser. No. 10/437,729, filed on May 13, 2003, and entitled "Methods For Etching Photolithographic Reticles", and U.S. Pat. No. 6,391,790, filed on May 21, 2002, which are incorporated by reference to the extent not inconsistent with the claimed aspects and disclosure herein.

The above described processing gas composition and processing regime is believed to provide controllable etching of openings or patterns with desired critical dimensions. The etching of the openings or patterns is generally anisotropic with the use of the processing gas described herein. The anisotropic process removes material deposited on the bottom of the opening at a higher rate than material on the sidewalls of the opening. This results in materials on the sidewalls of the openings being removed at a lower rate than materials on the bottoms of openings. An etch process that etches the sidewalls of the openings at a slower rate will be less likely to overetch the sidewalls allowing for improved preservation of the critical dimensions of the openings being etched, and, thus, reducing etching bias.

The invention is further described by the following examples that are not intended to limit the scope of the claimed invention.

EXAMPLES

A photolithographic reticle including a substrate made of an optically transparent material, such as optical quality quartz, fused silica, molybdenum silicide, molybdenum silicon oxynitride ($MoSi_xN_yO_z$), calcium fluoride, alumina, sapphire, or combinations thereof, with a chromium photomask layer, for example, between about 70 nanometers (nm) and about 100 nm thick disposed thereon, is introduced into a processing chamber for resist deposition. An optional ARC layer of chromium oxynitride, which may comprise up to about 25% of the total chromium depth, may be formed.

A resist, such as ZEP, a resist material commercially available from Tokyo-Oka of Japan, or a chemically amplified resist or CAR resist also commercially available from Tokyo-Oka of Japan, is deposited upon the chromium oxynitride layer and then patterned using conventional laser or electron beam patterning equipment. The resist deposited on the substrate is between about 200 nm and about 600 nm thick, for example, between about 300 nm and about 400 nm thick, but may be of any thickness desired.

Example 1

The reticle is placed in an etch chamber such as the DPS™ metal etch chamber described above. The patterned substrate also described above is placed on the cathode pedestal of the etch chamber, and the chamber is maintained at a pressure between about 8 milliTorr. A plasma was generated by applying a source RF voltage to the inductor coil at a power level of about 400 watts. A bias power of 20 watts was applied to the cathode pedestal. The substrate surface is maintained at a temperature between about 20° C. and about 50° C. The chamber walls and dome were cooled to less than about 70° C. to maintain a steady etch processing condition. The etching of the opening occurred under the following gas flows:

Oxygen ($O_2$), at 12 sccm
Chlorine gas ($Cl_2$), at 96 sccm
Hydrogen bromide (HBr), at 10-50 sccm.

The total flow rate was between about 158 sccm for the above listed processing gases. The etching process was performed for about 350 seconds form the openings in the metal layer.

Example 2

The reticle is placed in an etch chamber such as the DPS™ metal etch chamber described above. The patterned substrate also described above is placed on the cathode pedestal of the etch chamber, and the chamber is maintained at a pressure between about 5 milliTorr. A plasma was generated by applying a source RF voltage to the inductor coil at a power level of about 400 watts. A bias power of 20 watts was applied to the cathode pedestal. The substrate surface is maintained at a temperature between about 20° C. and about 50° C. The chamber walls and dome were cooled to less than about 70° C. to maintain a steady etch processing condition. The etching of the opening occurred under the following gas flows:

Oxygen ($O_2$), at 12 sccm
Chlorine gas ($Cl_2$), at 96 sccm
Hydrogen bromide (HBr), at 40 sccm.

The total flow rate was between about 148 sccm for the above listed processing gases. The etching process was performed for about 350 seconds form the openings in the metal layer.

Example 3

The reticle is placed in an etch chamber such as the DPS™ metal etch chamber described above. The patterned substrate also described above is placed on the cathode pedestal of the etch chamber, and the chamber is maintained at a pressure between about 5 milliTorr. A plasma was generated by applying a source RF voltage to the inductor coil at a power level of about 600 watts. A bias power of 20 watts was applied to the cathode pedestal. The substrate surface is maintained at a temperature between about 20° C. and about 50° C. The chamber walls and dome were cooled to less than about 70° C. to maintain a steady etch processing condition. The etching of the opening occurred under the following gas flows:

Oxygen ($O_2$), at 12 sccm
Chlorine gas ($Cl_2$), at 96 sccm
Hydrogen bromide (HBr), at 50 sccm.

The total flow rate was between about 158 sccm for the above listed processing gases. The etching process was performed for about 350 seconds form the openings in the metal layer.

While the foregoing is directed to the exemplary aspects of the invention, other and further aspects of the invention may be devised without departing from the basic scope thereof, and the scope thereof is determined by the claims that follow.

What is claimed is:

1. A method etching a chromium-containing layer, comprising:
   positioning a substrate having a chromium-containing layer disposed thereon in a processing chamber, and a patterned resist material disposed on the chromium-containing layer and exposing a portion of the chromium-containing layer;
   forming a plasma from an oxygen containing gas, a chlorine containing gas, and a chlorine-free halogen containing gas selected from the group consisting of hydrogen bromide, hydrogen iodide, and combinations thereof, with a molar ratio of chlorine gas to chlorine-free halogen containing gas between about 10:1 and about 0.5:1 by applying power to a coil and a bias to a substrate support in the processing chamber; and
   etching the chromium-containing layer in the presence of the plasma.

2. The method of claim 1, wherein the chromium-containing layer is a chromium material selected from the group consisting of chromium, chromium oxynitride, and combinations thereof.

3. The method of claim 1, wherein forming the plasma further comprises:
   forming the plasma from at least one of oxygen, carbon monoxide, and carbon dioxide;
   forming the plasma from at least one of chlorine, carbon tetrachloride and hydrogen chloride; and
   forming the plasma from at least one of hydrogen bromide and hydrogen iodide.

4. The method of claim 1, wherein forming the plasma further comprises:
   forming the plasma from oxygen, chlorine, and hydrogen bromide.

5. The method of claim 1, wherein forming the plasma further comprises:
   forming the plasma from at least one of helium, argon, xenon, neon and krypton.

6. The method of claim 1, wherein forming the plasma further comprises:
   applying a source RF power between about 100 watts and about 1000 watts to a coil in the processing chamber; and applying a bias power between about 0 watts and about 150 watts to a substrate support disposed in the processing chamber.

7. The method of claim 1, wherein etching the chromium-containing layer further comprises:
removing the chromium-containing layer relative to patterned resist layer at a ratio of between about 1:1 and about 3:1.

8. The method of claim 1 further comprising:
a patterned antireflective coating disposed between the chromium-containing layer and the patterned resist layer;
etching the chromium-containing layer through an anti-reflective coating; and
etching the anti-reflective coating during the etching of the chromium-containing layer.

9. The method of claim 8, wherein the anti-reflective coating is chromium oxynitride.

10. The method of claim 1, wherein the substrate is optically transparent.

11. The method of claim 10, wherein the optically transparent substrate comprises a silicon-based material selected from the group consisting of quartz, molybdenum silicide, molybdenum silicon oxynitride, and combinations thereof.

12. A method for etching a chromium-based layer, comprising:
positioning an optically transparent silicon-based substrate having a chromium-based layer on a support member in a processing chamber, wherein the chromium-based layer has a patterned resist material deposited thereon and exposing a portion of the chromium-based layer;
forming a plasma from a processing gas comprising chlorine gas, oxygen gas, and hydrogen bromide with a molar ratio of chlorine gas to hydrogen bromide gas between about 10:1 and about 0.5:1 ; and
etching exposed portions of the chromium-based layer at a removal rate ratio of chromium-based layer to resist material of about 1:1 or greater.

13. The method of claim 12, wherein the processing gas further comprising at least one of an inert gas selected from the group consisting of helium, argon, xenon, neon, krypton, and combinations thereof.

14. The method of claim 12 further comprising:
a layer of MoSi disposed between the optically transparent silicon-based substrate and the chromium-based layer.

15. The method of claim 12, wherein the chromium-based layer comprises chromium, chromium oxynitride, or combinations thereof, and the optically transparent silicon-based substrate comprises quartz, molybdenum silicide, molybdenum silicon oxynitride, or combinations thereof.

16. The method of claim 15, wherein the substrate further comprises an anti-reflective coating of chromium oxynitride.

17. A method for processing a chromium layer, comprising:
positioning a reticle on a support member in a processing chamber, wherein the reticle comprises a chromium-based photomask layer formed on an optically transparent silicon-based material, the chromium-based photomask layer having a patterned resist material deposited thereon and exposing a portion of the chromium-based photomask layer;
introducing a processing gas comprising chlorine gas, oxygen gas, and hydrogen bromide;
maintaining a chamber pressure between about 3 milliTorr and about 8 milliTorr;
delivering a source power of about 400 watts to a coil disposed in the processing chamber to generate a plasma;
supplying a bias power to the support member of about 20 watts; and
etching exposed portions of the chromium-based photomask layer.

\* \* \* \* \*